United States Patent [19]

Yamazaki et al.

[11] Patent Number: 5,056,217
[45] Date of Patent: Oct. 15, 1991

[54] METHOD FOR MANUFACTURING SEMICONDUCTOR ELEMENTS EQUIPPED WITH LEADS

[75] Inventors: Nobuto Yamazaki; Akihiro Nishimura, both of Tokyo, Japan

[73] Assignee: Kabushiki Kaisha Shinkawa, Tokyo, Japan

[21] Appl. No.: 510,035

[22] Filed: Apr. 16, 1990

[30] Foreign Application Priority Data

Apr. 17, 1989 [JP] Japan .................................. 1-96950

[51] Int. Cl.⁵ .............................................. H01R 43/02
[52] U.S. Cl. ........................................ 29/860; 29/827;
228/51; 228/180.1; 361/409
[58] Field of Search ................... 228/180.1, 180.2, 51,
228/53, 54; 29/827; 361/409

[56] References Cited

U.S. PATENT DOCUMENTS

| 3,430,835 | 3/1969 | Grable et al. | 29/827 X |
| 3,630,450 | 3/1972 | Larson et al. | 228/53 X |
| 3,673,681 | 7/1972 | Steran Ka | 361/409 X |
| 4,053,096 | 10/1977 | Heim | 228/180.2 X |
| 4,142,288 | 3/1979 | Flammer et al. | 228/180.1 X |

FOREIGN PATENT DOCUMENTS

| 45-24048 | 8/1970 | Japan | 29/827 |
| 45-29855 | 9/1970 | Japan | 29/827 |
| 63-256267 | 10/1988 | Japan | 228/51 |

Primary Examiner—Carl J. Arbes
Attorney, Agent, or Firm—Koda and Androlia

[57] ABSTRACT

Method of manufacturing semiconductor elements equipped with leads which are connected to electrodes and formed of wires including the steps of positioning each semiconductor element on a bonding stage, feeding a tip end of the wire under a bonding tool so that the bonding tool presses the tip end against the electrode to bond it to the electrode, shifting the bonding tool to away from the tip end and pressing the wire against wire-cutting section of the bonding stage, and pulling the wire away from the bonding tool to cut the wire.

2 Claims, 3 Drawing Sheets

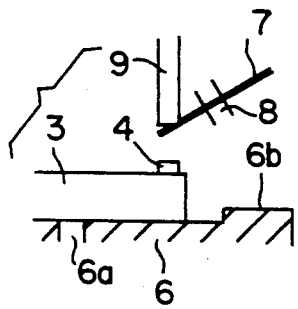
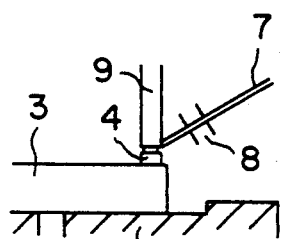
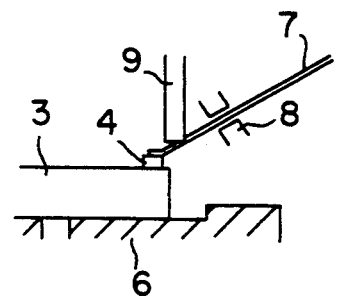
FIG. 1(a)   FIG. 1(b)   FIG. 1(c)
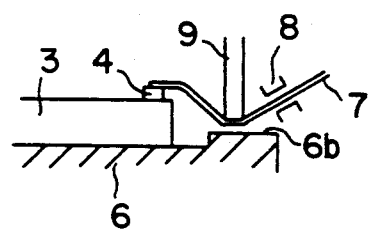
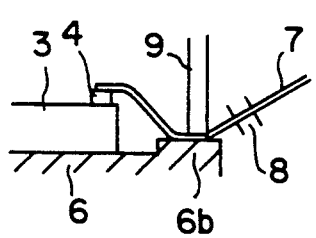
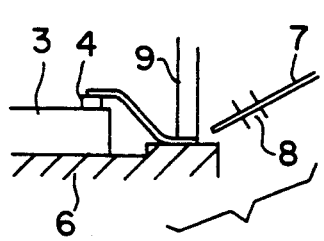
FIG. 1(d)   FIG. 1(e)   FIG. 1(f)
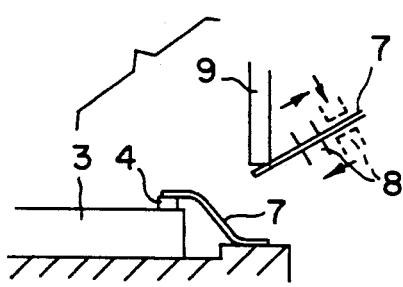
FIG. 1(g)

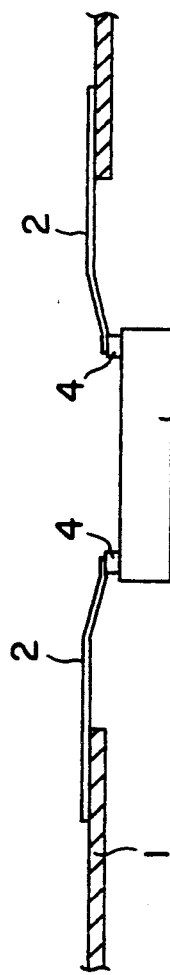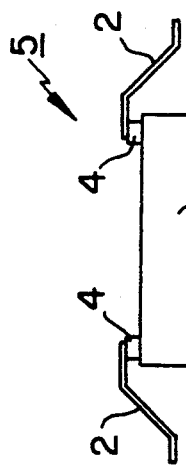
FIG. 3(a) PRIOR ART
FIG. 3(b) PRIOR ART

METHOD FOR MANUFACTURING SEMICONDUCTOR ELEMENTS EQUIPPED WITH LEADS

BACKGROUND OF THE INVENTION

1. Field of the Invention

The present invention relates to a method for manufacturing semiconductor elements equipped with leads.

2. Prior Art

Conventionally, semiconductor elements equipped with leads have been manufactured by the method illustrated in FIGS. 3(a) and 3(b).

As shown in FIG. 3(a), leads 2 formed on a tab tape 1 are bonded to the electrodes 4 of a semiconductor element 3; then, as shown in FIG. 3(b), the leads 2 are formed (or bent), cut and separated from the tab tape 1.

Methods of bonding the leads 2 of the tab tape 1 to the semiconductor element 3 as shown in FIG. 3(a) are disclosed in, for example, Japanese Patent Application Laid-Open Nos. 46-2109 and 59-110128.

In the prior art, the leads 2 must be installed on the tab tape 1 beforehand. Thus, tab tape 1 is disposed of as waste after the leads 2 are bonded to the semiconductor elements. As a result, the costs of the materials required has a tendency to increase. In addition, a process to install the leads on the tab tape 1 is required, and a subsequent forming and cutting process of the leads is also necessary. Accordingly, numerous processes are required for the manufacture of the semiconductor elements, and equipment expenditures are considerable. For these reasons as well, the cost of the product is increased.

SUMMARY OF THE INVENTION

Accordingly, the main object of the present invention is to provide a method for manufacturing semiconductor elements equipped with leads in which overall costs are greatly reduced.

The object of the present invention is accomplished as follows: (a) each semiconductor element to which leads are to be bonded is positioned and held on a bonding stage, (b) a wire which runs along the undersurface of a bonding tool is pressed against each of the electrodes and bonded by the bonding tool, (c) the bonding tool is moved to a point above the wire-cutting section of the bonding stage as the wire is subsequently played out, (d) the wire is then pressed against the wire-cutting section of the bonding stage, and then (e) the wire is cut, so that a lead consisting of the wire is formed (or attached) on each electrode of the semiconductor element.

With this method, since the wire lead itself is bonded to each of the electrodes of the semiconductor element by the bonding tool, there is no need to form leads on a tab tape beforehand as in conventional methods. There is no need for any forming and cutting process, either.

BRIEF DESCRIPTION OF THE DRAWINGS

FIGS. 1(a) through 1(g) are explanatory diagrams which illustrate one embodiment of the present invention;

FIG. 2 shows a lead-equipped semiconductor element manufactured by the method illustrated in FIG. 1, wherein

FIGS. 3(a) and 3(b) are explanatory diagrams which illustrate a conventional method.

DETAILED DESCRIPTION OF THE INVENTION

Figure 2A:
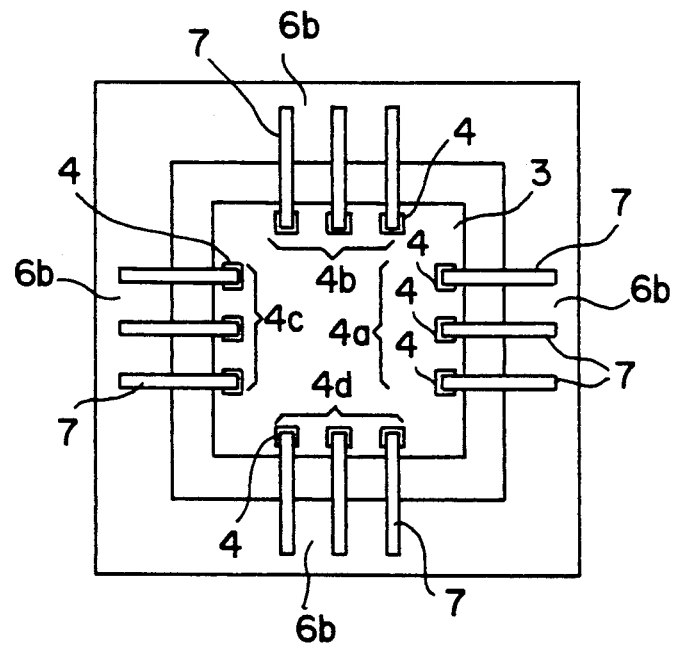
FIG. 2(a) is a plan view and FIG. 2(b) is a cross section.

One embodiment of the present invention will be described with reference to FIGS. 1 and 2.

Reference numeral 6 is a bonding stage, and a vacuum suction hole 6a which holds a semiconductor element 3 by vacuum suction and a wire-cutting section 6b are formed in/on the bonding stage 6. The bonding stage 6 positions and holds the semiconductor element 3 [to which leads are to be bonded].

The tip of a wire 7 which is wound on a spool (not shown) is extended by a fixed amount along the undersurface of a bonding tool 9 via a wire guide (not shown) and a clamper 8. The wire 7 is a ribbon-form wire which is rectangular or square in cross section.

From the position shown in FIG. 1(a), the bonding tool 9 is lowered from a point above each electrode 4 of the semiconductor element 3 so that the wire 7 is pressed against the electrode 4 and bonded thereto as shown in FIG. 1(b).

Next, as shown in FIG. 1(c), the clamper 8 is opened, the bonding tool 9 rises, and the wire 7 is played out.

Then, the bonding tool 9 is lowered onto the wire-cutting section 6b of the bonding stage 6 by the actions shown in FIG. 1(d) and FIG. 1(e) so that the wire 7 is pressed against the wire-cutting section 6b. In this state, the clamper 8 is closed.

The clamper 8 is then caused to move obliquely upward as shown in FIG. 1(f), so that the wire 7 is pulled and cut by the bottom of the bonding tool 9.

Next, as shown in FIG. 1(g), the bonding tool 9 rises, and the clamper 8 opens, rises obliquely, closes (to hold wire) and then lowers obliquely. As a result, the tip of the wire 7 is extended to the undersurface of the bonding tool 9 so that next bonding is ready.

Afterward, the bonding tool 9, wire 7 and clamper 8 are moved (while maintaining the above-described state) to a point above the next electrode 4 to which the lead is to be bonded as shown in FIG. 1(a).

The wire 7 is bonded to the electrodes 4 provided on one side of the semiconductor element 3 by successively repeating the above described series of actions.

For example, when bonding of the wire 7 to the electrode group 4a on one side of the semiconductor element 3 is completed, either the bonding tool 9 or the bonding stage 6 is rotated 90 degrees so that the bonding tool 9 is matched to the electrode group 4b on another side of the semiconductor element 3. Thus, bonding of the wire 7 to the electrode group 4b is accomplished.

Afterward, the wire 7 is successively bonded to the electrodes of electrode group 4b by the actions described above. When the bonding of the wire 7 to electrode group 4b is completed, the wire is similarly bonded to electrode groups 4c and 4d.

Thus, the wire 7 is bonded to all the electrodes 4 as shown in FIG. 2. Then, the vacuum of the bonding stage 6 is switched off, and the semiconductor element 3 is removed. As a result of this operation, a semiconductor element equipped with leads which has the same configuration as the lead-equipped semiconductor element 5 shown in FIG. 3(b) is manufactured.

Thus, there is no need to use any materials which are disposed of as waste, and the process can be performed in a wire bonding process. Accordingly, the method of the present invention is superior in terms of processes and equipment required and makes it possible to achieve a great reduction in cost.

Figure 2B:
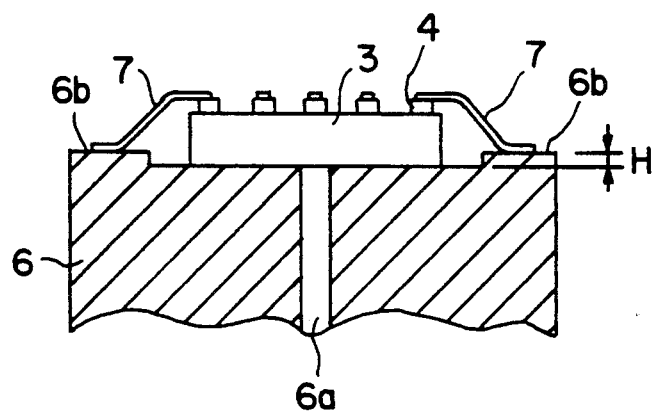

In the above embodiment, forming of the wire 7 connected to the semiconductor element 3 can vary by differentiating the height H of the wire-cutting section 6b of the bonding stage 6 and altering the movement track of the bonding tool 9 (FIG. 2(b)).

Meanwhile, the tip of the wire 7 connected to the semiconductor element 3 tends to rise slightly as a result of spring-back following the cutting process. Accordingly, it is preferable to take the amount of spring-back into account when setting the height of the wire-cutting section 6b of the bonding stage 6.

There are no particular restrictions on the material of the wire 7, as long as the wire is conductive. However, contamination of the pressing part (bottom) of the bonding tool 9 (or of the pressing surface of a separate tool used to press the wire 7 during subsequent processes) by oxides, etc., created during heating and pressing, can be prevented if an Au wire or an Au-plated wire is used.

The wire 7 is not restricted to be rectangular or square in cross section. However, semiconductor elements 3 which have a short signal transmission time tends to suffer from signal attenuation caused by inductance. Accordingly, wires having rectangular or square cross-sections are better than round wires.

Furthermore, in the embodiment, a wedge is used as the bonding tool 9; however, a capillary can also be used.

As described in detail in the above, each semiconductor element to which leads are to be bonded is positioned and held on a bonding stage, a wire which runs along the undersurface of the bonding tool is pressed against each of the electrodes and bonded by the bonding tool. Furthermore, the bonding tool is moved to a point above the wire-cutting section of the bonding stage as the wire is subsequently played out, the wire is then pressed against the wire-cutting section, and the wire is cut, so that a lead consisting of the wire is formed on each electrode of the semiconductor element. Accordingly, a great reduction in cost is achieved.

We claim:

1. A method for manufacturing semiconductor elements equipped with leads by bonding leads to electrodes of the semiconductor elements comprising the ordered steps of:

positioning and holding each semiconductor element at a bonding stage;

extending a predetermined amount of wire along an undersurface of a bonding tool via a wire guide and a wire clamp;

clamping said wire with said clamper;

lowering said bonding tool to press and bond said wire to an electrode of said semiconductor elements;

unclamping said wire from said clamper;

raising the bonding tool and moving said bonding tool to a position above a wire-cutting section with said wire extending between said bonding tool and said wire-cutting section;

lowering said bonding tool to press said wire against said wire-cutting section;

clamping said wire with said clamper;

moving said clamper obliquely while said bonding tool is pressed against said wire-cutting section to pull and cut said wire; and raising said bonding tool and unclamping said wire.

2. A method for manufacturing semiconductor elements according to claim 1, wherein said wire is rectangular or square in cross section.

* * * * *